United States Patent
Nomiyama et al.

(10) Patent No.: US 11,434,422 B2
(45) Date of Patent: Sep. 6, 2022

(54) PHOSPHOR POWDER, COMPOSITE, AND LIGHT-EMITTING DEVICE

(71) Applicant: DENKA COMPANY LIMITED, Tokyo (JP)

(72) Inventors: Tomohiro Nomiyama, Tokyo (JP); Yusuke Takeda, Tokyo (JP); Taiyo Yamaura, Tokyo (JP); Tatsuya Okuzono, Tokyo (JP); Masaru Miyazaki, Tokyo (JP); Shintaro Watanabe, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/598,686

(22) PCT Filed: Mar. 24, 2020

(86) PCT No.: PCT/JP2020/013108
§ 371 (c)(1),
(2) Date: Sep. 27, 2021

(87) PCT Pub. No.: WO2020/203487
PCT Pub. Date: Oct. 8, 2020

(65) Prior Publication Data
US 2022/0145177 A1  May 12, 2022

(30) Foreign Application Priority Data
Mar. 29, 2019 (JP) ............... JP2019-069109

(51) Int. Cl.
*H01L 33/50* (2010.01)
*C09K 11/77* (2006.01)

(52) U.S. Cl.
CPC ...... *C09K 11/77348* (2021.01); *H01L 33/502* (2013.01)

(58) Field of Classification Search
CPC ................ C09K 11/77348; H01L 33/502
See application file for complete search history.

(56) References Cited

U.S. PATENT DOCUMENTS 9,464,226 B2  10/2016  Sakata et al.
9,570,655 B2   2/2017  Yoshimura et al.
(Continued)

FOREIGN PATENT DOCUMENTS

EP  2471890 A2     7/2012
JP  2006-257353 A  9/2006
(Continued)

OTHER PUBLICATIONS

Jun. 16, 2020 International Search Report issued in International Patent Application No. PCT/JP2020/013108.
(Continued)

*Primary Examiner* — Tracie Y Green
(74) *Attorney, Agent, or Firm* — Oliff PLC

(57) ABSTRACT

A phosphor powder composed of α-sialon phosphor particles containing Eu. In a case where an internal quantum efficiency after the phosphor powder is held at 600° C. for 1 hour in an air atmosphere is defined as P1 and an internal quantum efficiency after the phosphor powder is held at 700° C. for 1 hour in an air atmosphere is defined as P2, P1 is equal to or more than 70% and (P1−P2)/P1×100 is equal to or less than 2.8%.

5 Claims, 1 Drawing Sheet

(56) References Cited

U.S. PATENT DOCUMENTS

| | | | |
|---|---|---|---|
| 9,711,686 B2 | 7/2017 | Yoshimura et al. | |
| 10,266,766 B2 | 4/2019 | Emoto | |
| 11,236,269 B2* | 2/2022 | Takeda | C09K 11/7734 |
| 2006/0208260 A1 | 9/2006 | Sakuma et al. | |
| 2009/0021141 A1 | 1/2009 | Emoto et al. | |
| 2011/0133629 A1 | 6/2011 | Sakata et al. | |
| 2011/0279018 A1* | 11/2011 | Emoto | C09K 11/7734 |
| | | | 313/503 |
| 2013/0285104 A1 | 10/2013 | Yoshimura et al. | |
| 2013/0293093 A1* | 11/2013 | Nonogaki | C09K 11/7734 |
| | | | 313/503 |
| 2014/0197362 A1 | 7/2014 | Industries Ltd | |
| 2016/0204311 A1 | 7/2016 | Yoshimura et al. | |
| 2016/0280994 A1 | 9/2016 | Emoto | |

FOREIGN PATENT DOCUMENTS

| | | |
|---|---|---|
| JP | 2009-096882 A | 5/2009 |
| WO | 2010/018873 A1 | 2/2010 |
| WO | 2012/098932 A1 | 7/2012 |
| WO | 2014/077240 A1 | 5/2014 |

OTHER PUBLICATIONS

Feb. 11, 2022 Office Action issued in German Patent Application No. 112020001609.9.

Chung et al; "Synthesis of Ca-a-SiAlON: Eux phosphor powder by carbothermal-reduction-nitridation process;" Materials Chemistry and Physics 123; pp. 13-15; 2010.

* cited by examiner

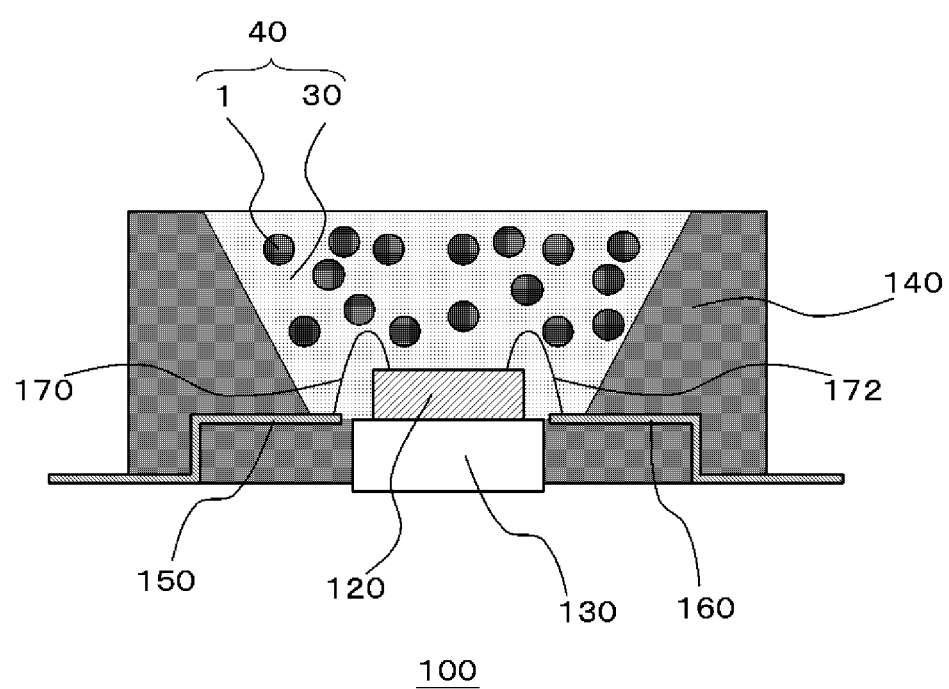

PHOSPHOR POWDER, COMPOSITE, AND LIGHT-EMITTING DEVICE

TECHNICAL FIELD

The present invention relates to a phosphor powder, a composite, and a light-emitting device.

BACKGROUND ART

As nitride and oxynitride phosphors, an α-sialon phosphor in which a specific rare earth element is activated is known to have useful fluorescence characteristics, and has been applied to a white LED and the like. The α-sialon phosphor has a structure in which Si—N bonds of α-silicon nitride crystals are partially substituted with Al—N bonds and Al—O bonds, and specific elements (Ca, Li, Mg, Y, or lanthanide metals except for La and Ce) penetrate into crystal lattices and are solid-dissolved in order to maintain electrical neutrality. The fluorescence characteristics are expressed by using some of the elements that penetrate into the lattices and are solid-dissolved as a rare earth element serving as a luminescent center. Among those, the α-sialon phosphor, in which Ca is solid-dissolved and the elements thereof are partially substituted with Eu, is relatively efficiently excited in a wide wavelength range from ultraviolet to blue light and exhibits emission of yellow to orange light. As an attempt to further improve the fluorescence characteristics of such an α-sialon phosphor, for example, it has been proposed to select an α-sialon phosphor having a specific average particle diameter by a classification treatment (Patent Document 1).

RELATED DOCUMENT

Patent Document

[Patent Document 1] Japanese Laid-open Patent Publication No. 2009-96882

SUMMARY OF THE INVENTION

Technical Problem

In recent years, a higher brightness of a white LED has been demanded. For example, a further improvement in the light emission characteristics of a phosphor powder used for the white LED has also been required.

The present invention has been made in view of the problems. An object of the present invention is to provide a phosphor powder having improved light emission characteristics.

Solution to Problem

According to the present invention, there is provided a phosphor powder composed of α-sialon phosphor particles containing Eu, in which in a case where an internal quantum efficiency after the phosphor powder is held at 600° C. for 1 hour in an air atmosphere is defined as P1 and an internal quantum efficiency after the phosphor powder is held at 700° C. for 1 hour in an air atmosphere is defined as P2, P1 is equal to or more than 70% and (P1−P2)/P1×100 is equal to or less than 2.8%.

Furthermore, according to the present invention, there is provided a composite including the above-mentioned phosphor powder and a sealing material that seals the phosphor powder.

In addition, according to the present invention, there is provided a light-emitting device including a light-emitting element that emits excitation light, and the above-mentioned composite that converts a wavelength of the excitation light.

Advantageous Effects of Invention

According to the present invention, it is possible to provide a technique relating to a phosphor powder having improved light emission characteristics.

BRIEF DESCRIPTION OF THE DRAWINGS

FIG. 1 is a schematic cross-sectional view showing a structure of a light-emitting device according to an embodiment.

DESCRIPTION OF EMBODIMENTS

Hereinafter, embodiments of the present invention will be described in detail.

The phosphor powder according to the embodiment is a phosphor powder composed of α-sialon phosphor particles containing Eu. In a case where an internal quantum efficiency after the phosphor powder is held at 600° C. for 1 hour in an air atmosphere is defined as P1 and an internal quantum efficiency after the phosphor powder is held at 700° C. for 1 hour in an air atmosphere is defined as P2, P1 is equal to or more than 70% and (P1−P2)/P1×100 is equal to or less than 2.8%.

With the phosphor powder of the present embodiment, it is possible to improve the fluorescence characteristics of α-sialon phosphor particles in the related art while holding the excitation wavelength range and the fluorescence wavelength range of the particles. Therefore, as a result, it is possible to improve the light emission characteristics of a light-emitting device using the phosphor powder of the present embodiment.

Detailed mechanism as a reason therefor is not clear, but is presumed to be as follows: a phosphor powder, in which P1 is equal to or more than 70% and (P1−P2)/P1×100 is equal to or less than 2.8%, has high chemical stability of the surface, and the elements and compounds that do not contribute to fluorescence are sufficiently removed. Therefore, it is considered that high fluorescence characteristics can be stably obtained even in a state of performing no heating.

(α-Sialon Phosphor Particles)

The α-sialon phosphor particles containing Eu are composed of an α-sialon phosphor which will be described below.

The α-sialon phosphor is an α-sialon phosphor containing an Eu element, represented by General Formula: $(M1_x, M2_y, Eu_z)(Si_{12-(m+n)}Al_{m+n})(O_n N_{16-n})$ (provided that M1 is a monovalent Li element and M2 are one or more divalent elements selected from the group consisting of Mg, Ca, and lanthanide elements (except for La and Ce)).

The solid dissolution composition of the α-sialon phosphor is expressed in x, y, and z in the general formula, and m and n determined by an Si/Al ratio and an O/N ratio associated therewith, and satisfies $0 \leq x < 2.0$, $0 \leq y < 2.0$, $0 < z \leq 0.5$, $0 < x+y$, $0.3 \leq x+y+z \leq 2.0$, $0 < m \leq 4.0$, $0 < n \leq 3.0$. In particular, in a case where Ca is used as M2, the α-sialon phosphor is stabilized in a wide composition range, and by partially substituting the elements of Ca with Eu serving as a luminescent center, excitation occurs by light in a wide wavelength range from ultraviolet to blue light, whereby a phosphor exhibiting emission of visible light ranging from yellow to orange light can be obtained.

In addition, from the viewpoint of obtaining light in bulb color in illumination applications, it is preferable that the α-sialon phosphor includes no Li or a small amount of L, if any, as the solid dissolution composition. In terms of the general formula, it is preferable to satisfy $0 \leq x \leq 0.1$. Furthermore or alternatively, a ratio of Li in the α-sialon phosphor is preferably equal to or more than 0% by mass and equal to or less than 1% by mass.

In general, the α-sialon phosphor has a second crystal phase different from that of the α-sialon phosphor or an amorphous phase which is inevitably present, the solid dissolution composition cannot be strictly defined by composition analysis or the like. As a crystal phase of the α-sialon phosphor, an α-sialon single phase is preferable, and the α-sialon phosphor may also include aluminum nitride or a polytypoid or the like thereof as another crystal phase.

In the α-sialon phosphor particles, a plurality of equi-axed primary particles are sintered to form aggregated secondary particles. The primary particles in the present embodiment refer to the smallest particles observable with an electron microscope or the like, in which the particles can exist singly. The shape of the α-sialon phosphor particle is not particularly limited. Examples of the shape include a spherical shape, a cubic shape, a columnar shape, and an amorphous shape.

The lower limit of the average particle diameter or the median diameter ($D_{50}$) of the α-sialon phosphor particles is preferably equal to or more than 1μ, more preferably equal to or more than 5 μm, and still more preferably equal to or more than 10 μm. In addition, the upper limit of the average particle diameter or the median diameter ($D_{50}$) of the α-sialon phosphor particles is preferably equal to or less than 30 μm, and more preferably equal to or less than 20 μm. The average particle diameter or the median diameter ($D_{50}$) of the α-sialon phosphor particles is a dimension for the secondary particles. By setting the average particle diameter or the median diameter ($D_{50}$) of the α-sialon phosphor particles to equal to or more than 5 μm, the transparency of the composite which will be described later can be further enhanced. On the other hand, by setting the average particle diameter or the median diameter ($D_{50}$) of the α-sialon phosphor particles to equal to or less than 30 μm, it is possible to suppress the occurrence of chipping in a case where the composite is cut with a dicer or the like.

Here, the average particle diameter of the α-sialon phosphor particles means a 50% diameter in a volume-based integrated fraction, determined by a laser diffraction scattering method in accordance with JIS R1629: 1997.

Here, the median diameter ($D_{50}$) of the phosphor powder means a median diameter ($D_{50}$) in a volume-based integrated fraction, determined by a laser diffraction scattering method in accordance with JIS R1629: 1997.

In a case where an internal quantum efficiency after the phosphor powder of the present embodiment is held at 600° C. for 1 hour in an air atmosphere is defined as P1, an internal quantum efficiency after the phosphor powder of the present embodiment is held at 700° C. for 1 hour in an air atmosphere is defined as P2, and an internal quantum efficiency after the phosphor powder of the present embodiment is held at 800° C. for 1 hour in an air atmosphere is P3, P1 is equal to or more than 70% and (P1−P2)/P1×100 is equal to or less than 2.8%.

Here, the internal quantum efficiency of the phosphor powder can be measured by a spectrophotometer equipped with an integrating sphere.

The internal quantum efficiency after the phosphor powder is held at each of the above-mentioned temperatures for 1 hour can be regarded as an index of the chemical stability of the surface of the α-sialon phosphor particle. It is considered that as compared with a phosphor powder in the related art, the phosphor powder of the present embodiment has extremely high chemical stability of the surface since the indexes defined by P1 and (P1−P2)/P1×100 satisfy the conditions.

It is more preferable that (P1−P2)/P1×100 is equal to or less than 1.5%. In this manner, it is possible to obtain a phosphor powder having higher chemical stability of the surface.

In the phosphor powder of the present embodiment, it is preferable that P2 is equal to or more than 68%, in addition to the indexes defined by P1 and (P1−P2)/P1×100 satisfying the conditions. In this manner, it is possible to further enhance the chemical stability of the surface of the α-sialon phosphor particle.

In addition, in the phosphor powder of the present embodiment, it is preferable that P3 is equal to or more than 68%, in addition to the conditions. In this manner, it is possible to further enhance the chemical stability of the surface of the α-sialon phosphor particle.

With the phosphor powder described above, it is possible to improve the fluorescence characteristics by satisfying both the condition that P1 is equal to or more than 70% and the condition that (P1−P2)/P1×100 is equal to or less than 2.8%.

(Other Characteristics)

The phosphor powder of the present embodiment preferably satisfies other characteristics, in addition to satisfying the above-mentioned characteristics relating to P1 and (P1−P2)/P1×100.

As an example of the characteristics, with regard to the phosphor powder, the ammonium ion concentration $C_A$ of the phosphor powder, determined from the following [Extracted Ion Analysis A], is preferably equal to or more than 15 ppm and 100 ppm, more preferably equal to or more than 15 ppm and equal to or less than 80 ppm, and still more preferably equal to or more than 15 ppm and equal to or less than 60 ppm.

$C_A$ which is within the numerical range is considered to correspond to, in particular, high chemical stability of the surface of the phosphor particle, and the high chemical stability of the surface of the phosphor particle easily enables the mother crystals of the phosphor which contributes to fluorescence to be stably present, and therefore, the fluorescence characteristics can be further improved.

[Extracted Ion Analysis A]

0.5 g of phosphor powder is added to 25 ml of distilled water in a polytetrafluoroethylene (PTFE)-made container with a lid, and held at 60° C. for 24 hours. Then, the total mass $M_A$ of ammonium ions contained in the aqueous solution from which the solid content has been removed by filtration is determined by using an ion chromatography method. Then, $C_A$ is determined by dividing $M_A$ by a mass of the phosphor powder. That is, $C_A$ is an index indicating the amount of ammonium ions per unit mass of the phosphor powder (solid).

For supplementary explanation, $M_A$ can be determined by multiplying the ammonium ion concentration of the aqueous solution measured by the ion chromatography method by the mass (25 g) of water used.

In addition, $C_A$ is determined by dividing $M_A$ by the mass (0.5 g) of the phosphor powder provided for the analysis.

In a case where the unit of $M_A$ is "gram (g)", $C_A$ [unit: ppm] can be determined by dividing $M_A$ [unit: g] by the mass (0.5 g) of the phosphor powder and multiplying the calculated value by $10^6$.

As another example of the characteristics, the diffuse reflectance of the phosphor powder with respect to light at a wavelength of 600 nm is preferably equal to or more than 93 and equal to or less than 99%, and more preferably equal to or more than 94% and equal to or less than 96%. The diffuse reflectance can be measured by an ultraviolet-visible spectrophotometer equipped with an integrating sphere device. With regard to a method for measuring the diffuse reflectance, refer to Examples which will be described later.

The diffuse reflectance is an index indicating a degree of diffuse reflection of light. That is, the diffuse reflectance can be related to the surface condition of a phosphor particle, the particle diameter of the phosphor particle, the particle size distribution of a phosphor powder, and the like. Although the details are unknown, it is presumed that the diffuse reflectance of the phosphor powder with respect to light at a wavelength of 600 nm which is within the numerical range indicates, for example, that a heterogeneous phase not contributing to fluorescence is sufficiently removed from the surface of the phosphor particle.

In the present embodiment, particularly from the viewpoints of good fluorescence characteristics (luminous efficiency and the like), it is preferable that the median diameter $D_{50}$ of the phosphor powder is equal to or more than 10 μm and equal to or less than 20 μm, and the diffuse reflectance with respect to light at a wavelength of 600 nm is within the numerical range.

(Method for Producing Phosphor Powder)

A method for producing a phosphor powder composed of the α-sialon phosphor particles of the present embodiment will be described. In the α-sialon phosphor particles, a part of a raw material powder mainly undergoes a reaction to form a liquid phase, and each of the elements moves through the liquid phase in the synthesis process, whereby formation of a solid solution and grain growth proceed.

First, the raw materials including the elements constituting the α-sialon phosphor particles containing Eu are mixed. Calcium is solid-dissolved at a high concentration into α-sialon phosphor particles having a low oxygen content, which have been synthesized using calcium nitride as a calcium raw material. In particular, in a case where the Ca solid dissolution concentration is high, it is possible to obtain a phosphor having a light emission peak wavelength on a higher wavelength side (equal to or more than 590 nm, more specifically equal to or more than 590 nm and equal to or less than 610 nm, and still more specifically equal to or more than 592 nm and equal to or less than 608 nm) than a composition in the related art, using an oxide raw material. Specifically, in the general formula, it is preferable to satisfy $1.5<x+y+z\leq2.0$. It is also possible to finely tune the emission spectrum by partially substituting the elements of Ca with Li, Mg, Sr, Ba, Y, and lanthanide elements (except for La and Ce).

Examples of a raw material powder other than those include silicon nitride, aluminum nitride, and an Eu compound. Examples of the Eu compound include europium oxide, a compound that turns into europium oxide after heating, and europium nitride. Europium nitride, which can reduce the amount of oxygen in the system, is preferable.

In a case where an appropriate amount of the α-sialon phosphor particles previously synthesized is added to a raw material powder, this addition can serve as a base point of the grain growth to obtain α-sialon phosphor particles having relatively short-axis diameters, and the particle shapes can be controlled by changing the forms of the α-sialon particles to be added.

Examples of a method of mixing the above-mentioned respective raw materials include a dry mixing method and a method in which wet mixing is performed in an inert solvent that does not substantially react with the respective components of the raw materials, and then the solvent is removed. Examples of a mixing device include a V type mixer, a rocking mixer, a ball mill, and a vibrating mill. Mixing of calcium nitride which is unstable in the atmosphere is preferably performed in a glove box in an inert atmosphere since the hydrolysis and the oxidation of the substance give an influence on the characteristics of a synthetic product.

A container made of a material having a low reactivity with a raw material and a phosphor to be synthesized, for example, a container made of boron nitride is filled with a powder obtained by mixing (hereinafter simply referred to as a raw material powder). Then, the powder is heated for a predetermined time in a nitrogen atmosphere. In this manner, an α-sialon phosphor can be obtained. A temperature for the heat treatment is preferably equal to or higher than 1,650° C. and equal to or lower than 1,950° C.

By setting the temperature for the heat treatment to equal to or higher than 1,650° C., it is possible to reduce the amount of residual unreacted products and make the primary particles sufficiently grow. In addition, by setting the temperature to equal to or lower than 1,950° C., it is possible to suppress remarkable sintering between the particles.

From the viewpoint of suppressing sintering between the particles during the heating, it is preferable that the container is filled with an increased volume of the raw material powder. Specifically, it is preferable that a bulk density at the time of filling the raw material powder in the container is set to equal to or less than 0.6 g/cm$^3$.

The heating time for the heat treatment is preferably equal to or more than 2 hours and equal to or less than 24 hours in terms of a time range during which there are no inconveniences such as presence of a large amount of residual unreacted substances, insufficient growth of primary particles, and sintering between the particles.

In the above-mentioned step, an α-sialon phosphor having an ingot-shaped outer form is produced. By subjecting this ingot-shaped α-sialon phosphor to a pulverizing step in which the phosphor is pulverized by a pulverizer such as a crusher, a mortar pulverizer, a ball mill, a vibrating mill, and a jet mill, and a sieve classification step after such the pulverizing treatment, it is possible to obtain a phosphor powder composed of α-sialon phosphor particles having an adjusted $D_{50}$ particle diameter of secondary particles. In addition, it is possible to adjust the $D_{50}$ particle diameter of the secondary particles by performing a step in which the phosphor powder is dispersed in an aqueous solution to remove the secondary particles which have small particle diameters and are hardly settled.

The phosphor powder composed of the α-sialon phosphor particles according to the embodiment can be manufactured by carrying out the above-mentioned steps and then carrying out an acid treatment step.

In the acid treatment step, for example, the α-sialon phosphor particles are immersed in an acidic aqueous solution. Examples of the acidic aqueous solution include an acidic aqueous solution including one kind of acid selected from acids such as hydrofluoric acid, nitric acid, and hydrochloric acid, and an aqueous mixed acid solution obtained by mixing two or more kinds of the acids. Among these, an aqueous hydrofluoric acid solution including hydrofluoric acid alone and an aqueous mixed acid solution obtained by mixing hydrofluoric acid and nitric acid are more preferable. The stock solution concentration of the acidic aqueous solution is appropriately set depending on the strength of an acid used, but is, for example, preferably equal to or more than 0.7% and equal to or less than 100%, and more preferably equal to or more than 0.7% and equal to or less than 40%. In addition, a temperature at which the acid treatment is carried out is preferably equal to or higher than 25° C. and equal to or lower than 90° C., and more preferably equal to or higher than 60° C. and equal to or lower than 90° C., and the reaction time (immersion time) is preferably equal to or more than 15 minutes and equal to or less than 80 minutes.

Preferred aspects of the acid treatment step include an aspect in which the phosphor powder is added to an acidic solution and then the mixture is stirred for a certain period of time. In this manner, a reaction with the acid can proceed more reliably on the surface of the α-sialon phosphor particle. By performing the stirring at a high speed, the acid treatment on the particle surface is likely to be sufficiently performed. The term "high speed" as used herein depends on a stirring device used, but in a case where a laboratory-level magnetic stirrer is used, the stirring speed is, for example, equal to or more than 400 rpm, and in reality, equal to or more than 400 rpm and equal to or less than 500 rpm. For the purpose of normal stirring, which is to constantly supply a new acid to the particle surface, a stirring speed of approximately 200 rpm is sufficient, but by performing the stirring at a high speed of equal to or more than 400 rpm, the elements and compounds not contributing to fluorescence are sufficiently removed and/or the chemical stability of the particle surface is enhanced due to a physical action in addition to a chemical action.

The conditions that P1 is equal to or more than 70% and (P1−P2)/P1×100 is equal to or less than 2.8%, each defined for the internal quantum efficiency after the heat treatment, as mentioned above, can be controlled by optimally adjusting the stock solution concentration of an acidic aqueous solution used for an acid treatment, a temperature at the time of the acid treatment, a reaction time, a stirring speed, and the like. For example, by adopting conditions which approximate to a combination of the stock solution concentration of an acidic aqueous solution, a temperature during an acid treatment, a reaction time, and a stirring speed, with reference to abundant Examples which will be described below, thus to carry out the acid treatment, it is possible to adjust P1 and (P1−P2)/P1×100 of the phosphor powder to desired values.

(Composite)

The composite according to an embodiment includes the above-mentioned phosphor particles and a sealing material that seals the phosphor particles. In the composite according to the present embodiment, a plurality of the above-mentioned phosphor particles are dispersed in the sealing material. As the sealing material, a well-known material such as a resin, a glass, and ceramics can be used. Examples of the resin used for the sealing material include transparent resins such as a silicone resin, an epoxy resin, and a urethane resin.

Examples of a method for manufacturing the composite include a manufacturing method in which a powder composed of α-sialon phosphor particles of the present embodiment is added to a liquid resin, a powdered glass, or ceramics, and the mixture is mixed uniformly, and then cured or sintered by a heat treatment.

(Light-Emitting Device)

FIG. 1 is a schematic cross-sectional view showing a structure of a light-emitting device according to the present embodiment. As shown in FIG. 1, a light-emitting device 100 includes a light-emitting element 120, a heat sink 130, a case 140, a first lead frame 150, a second lead frame 160, a bonding wire 170, a bonding wire 172, and a composite 40.

The light-emitting element 120 is mounted in a predetermined region on the upper surface of the heat sink 130. By mounting the light-emitting element 120 on the heat sink 130, the heat dissipation of the light-emitting element 120 can be enhanced. Further, a packaging substrate may be used instead of the heat sink 130.

The light-emitting element 120 is a semiconductor element that emits excitation light. As the light-emitting element 120, for example, an LED chip that generates light at a wavelength of equal to or more than 300 nm and equal to or less than 500 nm, corresponding to near-ultraviolet to blue light, can be used. One electrode (not shown in the drawings) arranged on the upper surface side of the light-emitting element 120 is connected to the surface of the first lead frame 150 through the bonding wire 170 such as a gold wire. In addition, the other electrode (not shown in the drawings) formed on the upper surface of the light-emitting element 120 is connected to the surface of the second lead frame 160 through the bonding wire 172 such as a gold wire.

In the case 140, a substantially funnel-shaped recess whose hole diameter gradually increases toward the upside from the bottom surface is formed. The light-emitting element 120 is provided on the bottom surface of the recess. The wall surface of the recess surrounding the light-emitting element 120 serves as a reflective plate.

The recess whose wall surface is formed by the case 140 is filled with the composite 40. The composite 40 is a wavelength conversion member that converts excitation light emitted from the light-emitting element 120 into light at a longer wavelength. The composite of the present embodiment is used as the composite 40, and α-sialon phosphor particles 1 of the present embodiment are dispersed in a sealing material 30 such as a resin. The light-emitting device 100 emits a mixed color of light of the light-emitting element 120 and light generated from the α-sialon phosphor particles 1 which are excited by absorbing the light of the light-emitting element 120. The light-emitting device 100 preferably emits white light by the mixed color of the light of the light-emitting element 120 and the light generated from the α-sialon phosphor particles 1.

In the light-emitting device 100 of the present embodiment, by setting P1 to equal to or more than 70% and setting (P1−P2)/P1×100 to equal to or less than 2.8% in a case where an internal quantum efficiency after a phosphor powder composed of the α-sialon phosphor particles 1 is held at 600° C. for 1 hour in an air atmosphere is defined as P1 and an internal quantum efficiency after the phosphor powder is held at 700° C. for 1 hour in an air atmosphere is defined as P2 as mentioned above, the fluorescence characteristics of the α-sialon phosphor particles 1 and the composite 40 can be improved, and the light emission intensity of the light-emitting device 100 can be improved.

In FIG. 1, a surface mounting type light-emitting device is illustrated, but the light-emitting device is not limited to the surface mounting type device. The light-emitting device may be of a cannonball type, a chip-on-board (COB) type, or a chip-scale-package (CSP) type.

The embodiments of the present invention have been described above, but these are examples of the present invention and various configurations other than the examples can also be adopted.

EXAMPLES

Hereinafter, the present invention will be described with reference to Examples and Comparative Examples, but the present invention is not limited thereto.

Example 1

In a glove box, 62.4 parts by mass of a silicon nitride powder (manufactured by Ube Kosan Co., Ltd., E10 grade), 22.5 parts by mass of an aluminum nitride powder (manufactured by Tokuyama Corporation, E grade), 2.2 parts by mass of an europium oxide powder (manufactured by Shin-Etsu Chemical Co., Ltd., RU grade), and 12.9 parts by mass of a calcium nitride powder (manufactured by Kojundo Chemical Lab. Co., Ltd.) were used as a blend composition of a raw material powder, and the raw material powders were dry-blended and then passed through a nylon-made sieve having a mesh size of 250 μm to obtain a raw material mixed powder. A cylindrical boron nitride-made container (manufactured by Denka Co., Ltd., N-1 grade) with a lid, having an internal volume of 0.4 liters, is filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and passed through a sieve having a mesh size of 150 μm to obtain a phosphor powder. With regard to this phosphor powder, the crystal phase was examined by powder X-ray diffraction measurement (X-ray Diffraction, hereinafter referred to as XRD measurement) using CuKα rays, and thus, the existing crystal phase was a Ca-α-sialon (α-sialon including Ca) containing an Eu element.

Next, 3.2 ml of 50% hydrofluoric acid and 0.8 ml of 70% nitric acid were mixed to obtain a mixed stock solution. 396 ml of distilled water was added to the mixed stock solution, and the concentration of the mixed stock solution was diluted to 1.0% to prepare 400 ml of an aqueous mixed acid solution. 30 g of a phosphor powder composed of the above-mentioned α-sialon phosphor particles was added to the aqueous mixed acid solution, the temperature of the aqueous mixed acid solution was kept at 80° C. in a beaker with a capacity of 500 ml, and the aqueous mixed acid solution was subjected to an acid treatment in which the aqueous mixed acid solution was immersed for 30 minutes under stirring at a rotation speed of 450 rpm using a magnetic stirrer. The powder after the acid treatment was thoroughly washed with distilled water, filtered, dried, and then passed through a sieve having a mesh size of 45 μm to manufacture a phosphor powder composed of the α-sialon phosphor particles of Example 1.

Example 2

A phosphor powder composed of α-sialon phosphor particles of Example 2 was manufactured by the same procedure as in Example 1, except that an aqueous mixed acid solution having a stock solution concentration of 1.0% was prepared by adding 396 ml of distilled water to a mixed stock solution obtained by mixing 1.2 ml of 50% hydrofluoric acid and 2.8 ml of 70% nitric acid, instead of the aqueous mixed acid solution used in Example 1.

Example 3

A phosphor powder composed of α-sialon phosphor particles of Example 3 was manufactured by the same procedure as in Example 1, except that an aqueous mixed acid solution having a stock solution concentration of 5.0% was prepared by adding 380 ml of distilled water to a mixed stock solution obtained by mixing 10 ml of 50% hydrofluoric acid and 10 ml of 70% nitric acid, instead of the aqueous mixed acid solution used in Example 1, and the phosphor powder was immersed for 30 minutes while the temperature of the aqueous mixed acid solution was kept at 30° C.

Example 4

A phosphor powder composed of α-sialon phosphor particles of Example 4 was manufactured by the same procedure as in Example 1, except that an aqueous mixed acid solution having a stock solution concentration of 25% was prepared by adding 300 ml of distilled water to a mixed stock solution obtained by mixing 50 ml of 50% hydrofluoric acid and 50 ml of 70% nitric acid, instead of the aqueous mixed acid solution used in Example 1, and the phosphor powder was immersed for 60 minutes while the temperature of the aqueous mixed acid solution was kept at 80° C.

Comparative Example 1

A phosphor powder composed of α-sialon phosphor particles of Comparative Example 1 was manufactured by the same procedure as in Example 1, except that an aqueous mixed acid solution having a stock solution concentration of 0.5% was used by adding 398 ml of distilled water to a mixed stock solution obtained by mixing 1.0 ml of 50% hydrofluoric acid and 1.0 ml of 70% nitric acid, instead of the aqueous mixed acid solution used in Example 1, the temperature of the aqueous mixed acid solution was kept at 80° C. in a beaker with a capacity of 500 ml, and the aqueous mixed acid solution was subjected to an acid treatment in which the aqueous mixed acid solution was immersed for 30 minutes under stirring at a rotation speed of 300 rpm using a magnetic stirrer.

The stock solution concentration of the aqueous mixed acid solution and the stirring rotation speed adopted in Comparative Example 1 were set to the levels which had been normally used in the related art.

(Measurement of Particle Size)

A particle size was measured by a laser diffraction scattering method in accordance with JIS R1629: 1997, using Microtrac MT3300EX II (MicrotracBEL Corporation). 0.5 g of a phosphor powder was put into 100 cc of ion exchange water, the mixture was subjected to a dispersion treatment with Ultrasonic Homogenizer US-150E (Nissei Corporation, chip size: φ20, Amplitude: 100%, oscillation frequency: 19.5 KHz, amplitude of vibration: about 31 μm) for 3 minutes, and then the particle size was measured with MT3300EX II. The median diameter ($D_{50}$) was determined from the obtained particle size distribution.

(Light Emission Characteristics)

With regard to each of the obtained phosphor powders, the internal quantum efficiency and the external quantum efficiency at room temperature were measured by a spectrophotometer (MCPD-7000 manufactured by Otsuka Electronics Co., Ltd.) and calculated by the following procedure.

The phosphor powder was filled so that the surface of a recess cell was smooth, and an integrating sphere was attached. Monochromatic light spectrally split into a wavelength of 455 nm from a light emission source (Xe lamp) was introduced into the integrating sphere using an optical fiber. A sample of the phosphor powder was irradiated with the monochromatic light as an excitation source, and measurement of the fluorescence spectrum of the sample was performed.

A standard reflective plate (Spectralon manufactured by Labsphere Inc.) having a reflectance of 99% was attached to a sample unit, and the spectrum of excitation light at a wavelength of 455 nm was measured. At that time, the number (Qex) of excitation light photons was calculated from a spectrum in the wavelength range of equal to or more than 450 nm and equal to or less than 465 nm.

A phosphor powder composed of the α-sialon phosphor particles was attached to the sample unit, and the number (Qref) of reflected excitation light photons and the number (Qem) of fluorescent light photons were calculated. The number of reflected excitation light photons was calculated in the same wavelength range as the number of excitation light photons, and the number of fluorescent light photons was calculated in the range of equal to or more than 465 nm and equal to or less than 800 nm.

Internal quantum efficiency=($Qem/(Qex-Qref)$)×100

External quantum efficiency=($Qem/Qex$)×100

In a case where the standard sample NSG1301 sold by Sialon Co., Ltd. was measured using the measurement method, the external quantum efficiency was 55.6% and the internal quantum efficiency was 74.8%. The device was calibrated using this sample as a standard.

In addition, the internal quantum efficiencies after heat treatments under the following three conditions were each independently measured.

(1) After the phosphor powder is held at 600° C. for 1 hour, the internal quantum efficiency P1 is measured.

(2) After the phosphor powder is held at 700° C. for 1 hour, the internal quantum efficiency P2 is measured.

(3) After the phosphor powder is held at 800° C. for 1 hour, the internal quantum efficiency P3 is measured.

The conditions for each heat treatment are listed below.

High-temperature atmosphere furnace (under air atmosphere)

Sample holding method: Sealing type (holding a sample in an alumina container with a lid, having an internal volume of 30 cc)

(P1−P2)/P1×100(%) was calculated using the obtained P1 and P2. The results obtained for the internal quantum efficiency and the external quantum efficiency are shown in Table 1.

Incidentally, the peak wavelength of the emission spectrum of the phosphor powder obtained by the measurement (excitation light wavelength: 455 nm) was 600 nm (a relatively high wavelength) in Examples 1 to 4.

(Measurement of Ammonium Ion Concentration $C_A$ in Phosphor Powder)

With regard to the phosphor powder of Example 2, the ammonium ion concentration $C_A$ was measured by the following procedure.

0.5 g of a phosphor powder was added to 25 ml of distilled water in a PTFE container with a lid. The container into which the phosphor powder and distilled water had been put was held at 60° C. for 24 hours, and then the solid content was removed by filtration. The ammonium ion concentration in the aqueous solution from which the solid content had been removed was measured by an ion chromatography device (manufactured by Thermo Fisher Scientific Inc.), and the total mass $M_A$ (unit: g) of the eluted ammonium ions was calculated. Then, $M_A$ was divided by the mass (0.5 g) of the phosphor powder and multiplied by $10^6$ to determine an ammonium ion concentration $C_A$ (unit: ppm) of the phosphor powder.

(Measurement of Diffuse Reflectance of Phosphor Powder)

With regard to the phosphor powder of Example 2, the diffuse reflectance at a wavelength of 600 nm was measured as follows.

The diffuse reflectance was measured by attaching an integrating sphere device (ISV-722) to an ultraviolet-visible spectrophotometer (V-650) manufactured by JASCO Corporation. Baseline correction was performed with a standard reflective plate (Spectralon), a solid sample holder filled with the phosphor powder was attached, and the diffuse reflectance with respect to light at a wavelength of 600 nm was measured.

Various types of information with regard to Examples and Comparative Examples are shown in Table 1.

Although not shown in Table 1, the ammonium ion concentration $C_A$ of the phosphor powder of Example 2 was 29 ppm. In addition, the diffuse reflectance at a wavelength of 600 nm of the phosphor powder of Example 2 was 94.8%.

TABLE 1

| | | | Example 1 | Example 2 | Example 3 | Example 4 | Comparative Example 1 |
|---|---|---|---|---|---|---|---|
| Acid treatment | Acid solution | 50% Hydrofluoric acid (ml) | 3.2 | 1.2 | 10 | 50 | 1.0 |
| | | 70% Nitric acid (ml) | 0.8 | 2.8 | 10 | 50 | 1.0 |
| | | Liquid ratio (amount of hydrofluoric acid: amount of nitric acid) | 8:2 | 3:7 | 5:5 | 5:5 | 5:5 |
| | | Distilled water (ml) | 396 | 396 | 380 | 300 | 398 |
| | | Stock solution concentration (%) | 1.0 | 1.0 | 5.0 | 25 | 0.5 |
| | Reaction conditions | Temperature (° C.) | 80 | 80 | 30 | 80 | 80 |
| | | Time (min) | 30 | 30 | 30 | 60 | 30 |
| | | Stirring speed (rpm) | 450 | 450 | 450 | 450 | 300 |
| Particle size | | $D_{50}$ (μm) | 15.6 | 14.5 | 14.8 | 16.3 | 15.6 |
| Internal quantum efficiency P1 (%) after 1 hour at 600° C. | | | 78.0 | 78.0 | 79.0 | 76.3 | 66.5 |
| Internal quantum efficiency P2 (%) after 1 hour at 700° C. | | | 76.0 | 78.0 | 78.0 | 75.6 | 64.6 |

TABLE 1-continued

|  |  | Example 1 | Example 2 | Example 3 | Example 4 | Comparative Example 1 |
|---|---|---|---|---|---|---|
| Internal quantum efficiency P2 (%) after 1 hour at 800° C. | | 75.0 | 75.0 | 76.0 | 72.5 | 64.6 |
| (P1−P2)/81 × 100 (%) | | 2.6 | 0.0 | 1.3 | 0.9 | 2.9 |
| Light emission characteristics | Internal quantum efficiency (%) | 79.9 | 80.3 | 80.2 | 77.1 | 73.7 |
|  | External quantum efficiency (%) | 71.0 | 71.0 | 71.3 | 67.6 | 65.7 |

As shown in Table 1, it was confirmed that the phosphor powder of Examples 1 to 4 satisfying the conditions that P1 was equal to or more than 70% and (P1−P2)/P1×100 was equal to or less than 2.8% had improvements in both the internal quantum efficiency and the external quantum efficiency, as compared with Comparative Example 1 not satisfying the condition.

Additional Comparative Example: Example in which Acid Treatment Condition was Changed in Example 2

A phosphor powder composed of the α-sialon phosphor particles was obtained in the same manner as in Example 2, except that the stirring speed by the magnetic stirrer during the acid treatment was changed from 450 rpm to 200 rpm which was a normal level.

With regard to the phosphor powder obtained in this Additional Comparative Example, the median diameter $D_{50}$ was 14.5 μm, the diffuse reflectance at a wavelength of 600 nm was 93.5%, and the ammonium ion concentration $C_A$ of the phosphor powder was 113 ppm.

In addition, with regard to the phosphor powder obtained in Additional Comparative Example, the internal quantum efficiency was 75.4% and the external quantum efficiency was 66.6%, which were the results inferior to the levels of Example 2 (and other Examples).

From the results of Additional Comparative Example, and the like, it is understood that:

the final phosphor powder is different between the case of the "high-speed stirring" in which the stirring speed in the acid treatment is 450 rpm (Example 2) and the case of the "low-speed stirring" in which the stirring speed in the acid treatment is 200 rpm, and the phosphor powder obtained by the low-speed stirring is deteriorated in light emission characteristics.

This application claims priority based on Japanese Application Japanese Patent Application No. 2019-069109 filed on Mar. 29, 2019, the disclosures of which are incorporated herein by reference in their entireties.

REFERENCE SIGNS LIST

1: α-sialon phosphor particle
30: sealing material
40: composite
100: light-emitting device
120: light-emitting element
130: heat sink
140: case
150: first lead frame
160: second lead frame
170: bonding wire
172: bonding wire

The invention claimed is:

1. A phosphor powder composed of α-sialon phosphor particles containing Eu,
   wherein the α-sialon phosphor particles are composed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, x=0, 0<y<2.0, 0<z≤0.5, 0<x+y, 0.3≤x+y+z≤2.0, 0<m≤4.0, and 0<n≤3.0 are satisfied, and
   in a case where an internal quantum efficiency after the phosphor powder is held at 600° C. for 1 hour in an air atmosphere is defined as P1 and an internal quantum efficiency after the phosphor powder is held at 700° C. for 1 hour in an air atmosphere is defined as P2, P1 is equal to or more than 70% and (P1−P2)/P1×100 is equal to or less than 2.8%.

2. The phosphor powder according to claim 1, wherein the internal quantum efficiency P2 is equal to or more than 68%.

3. The phosphor powder according to claim 1, wherein an internal quantum efficiency P3 after the phosphor powder is held at 800° C. for 1 hour is equal to or more than 68%.

4. A composite comprising:
   the phosphor powder according to claim 1; and
   a sealing material that seals the phosphor powder.

5. A light-emitting device comprising:
   a light-emitting element that emits excitation light; and
   the composite according to claim 4, that converts a wavelength of the excitation light.

* * * * *